(12) United States Patent
Kato

(10) Patent No.: US 6,316,999 B1
(45) Date of Patent: Nov. 13, 2001

(54) OPERATIONAL AMPLIFIER

(75) Inventor: Fumihiko Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,039

(22) Filed: Dec. 27, 1999

(30) Foreign Application Priority Data

Dec. 28, 1998 (JP) .................................................. 10-374199

(51) Int. Cl.[7] .................................................. H03F 3/45
(52) U.S. Cl. .......................................... 330/255; 330/253
(58) Field of Search .................................. 330/253, 255, 330/257, 261

(56) References Cited

U.S. PATENT DOCUMENTS

| | | | | |
|---|---|---|---|---|
| 4,524,328 | * | 6/1985 | Abou et al. ............................ | 330/253 |
| 5,515,005 | * | 5/1996 | Yoshioka ................................ | 330/255 |
| 5,670,910 | * | 9/1997 | Kato ....................................... | 330/255 |
| 5,751,186 | * | 5/1998 | Nakano .................................. | 330/253 |
| 5,831,480 | * | 11/1998 | Kato et al. ............................ | 330/255 |
| 5,909,146 | * | 6/1999 | Okada ................................... | 330/255 |
| 6,100,762 | * | 8/2000 | Kato ....................................... | 330/255 |

FOREIGN PATENT DOCUMENTS 9-93055  4/1997 (JP) .

* cited by examiner

*Primary Examiner*—Robert Pascal
*Assistant Examiner*—Khanh Van Nguyen
(74) *Attorney, Agent, or Firm*—Young & Thompson

(57) ABSTRACT

An operational amplifier comprising output stages K2 and K3 for outputting an output signal So in response to an input signal Si, wherein;

said output stages perform a push-pull operation respectively in response to a plurality of specific signals generated on the basis of said input signal and have a plurality of output stage transistors M65 and M66 for generating said output signal as a result of said push-pull operation, and said plurality of specific signals are generated as signals being substantially equal to each other in delay time until they are inputted respectively into said plurality of output stage transistors.

15 Claims, 13 Drawing Sheets

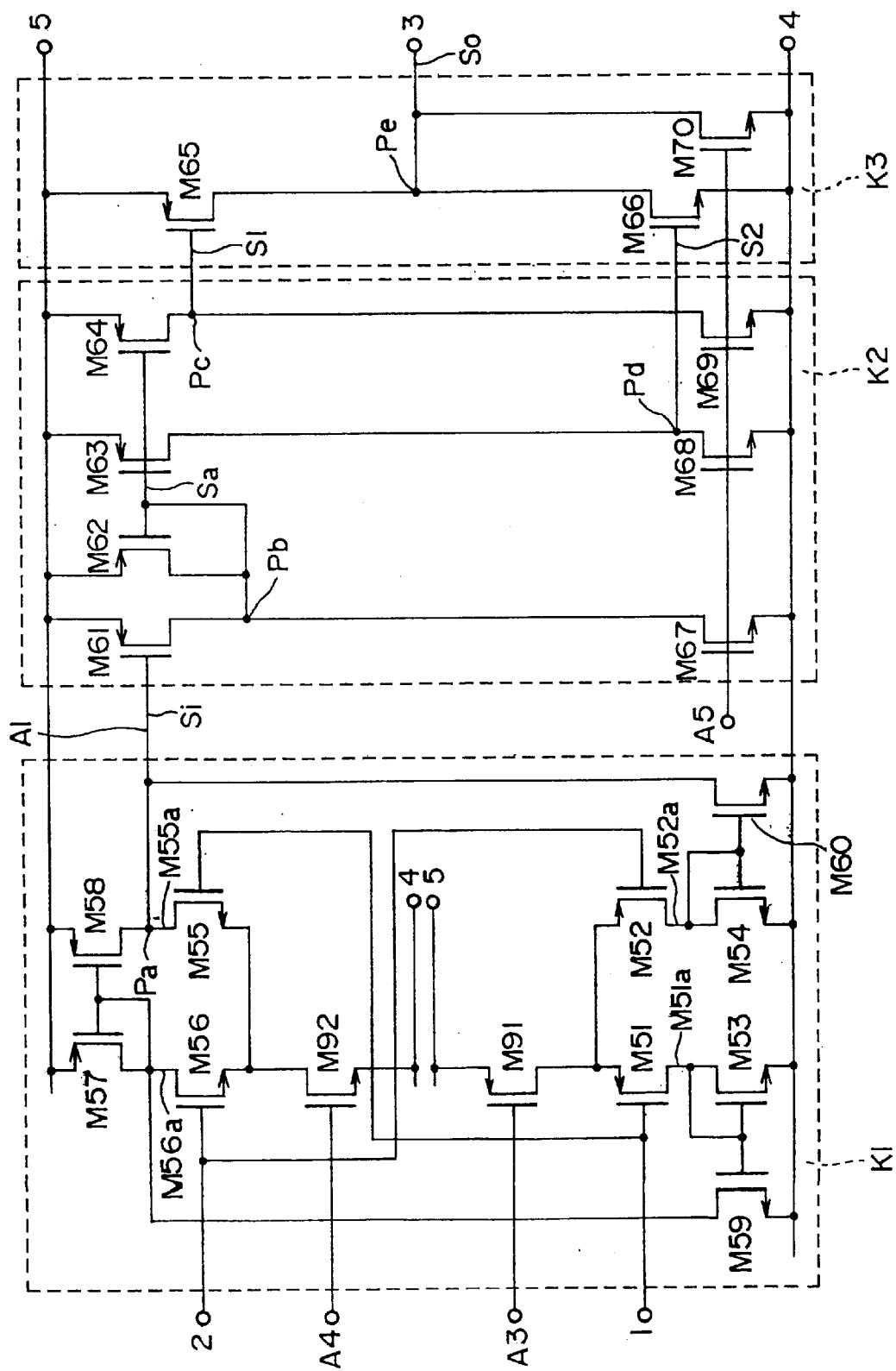
F I G. 1

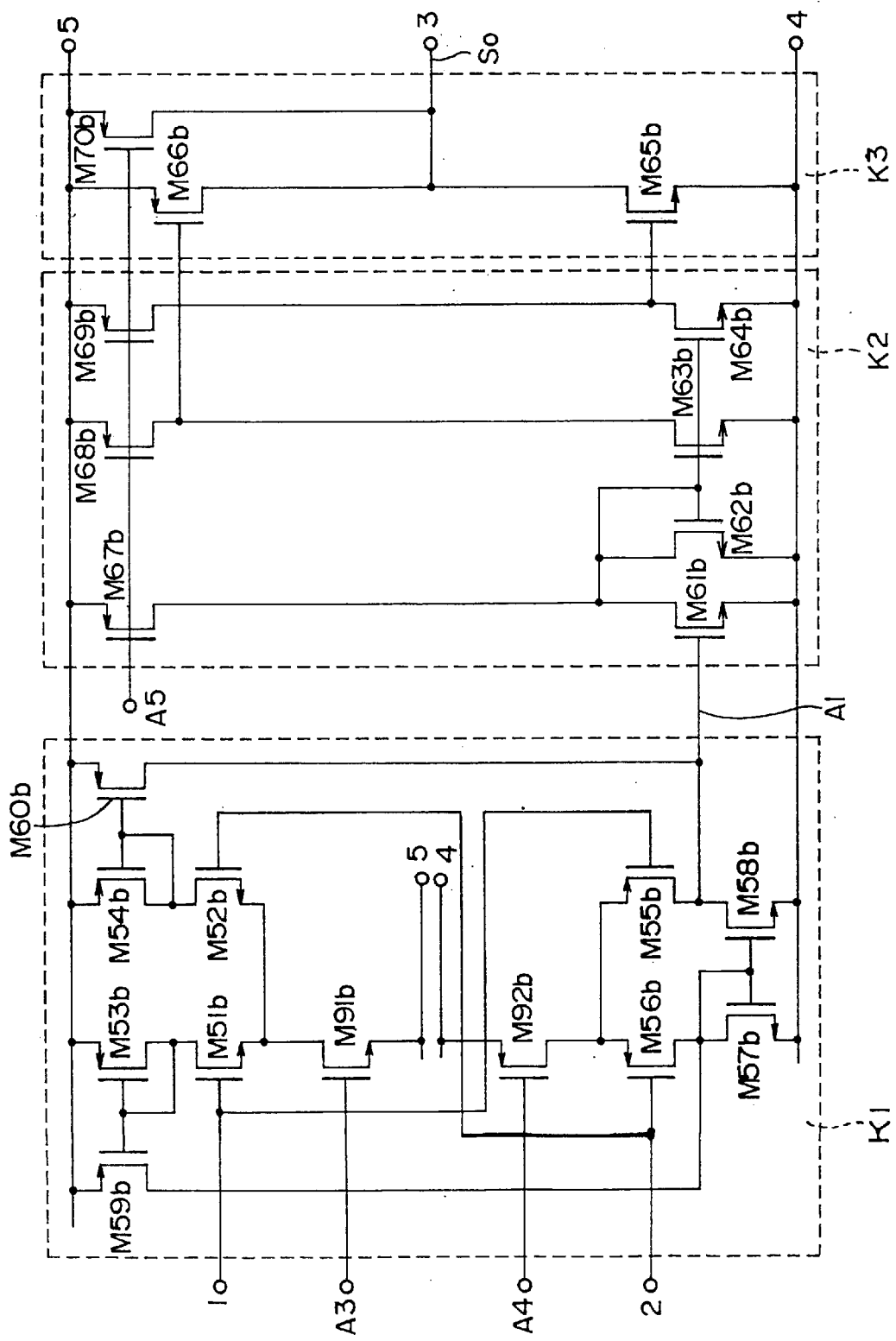
F I G. 3

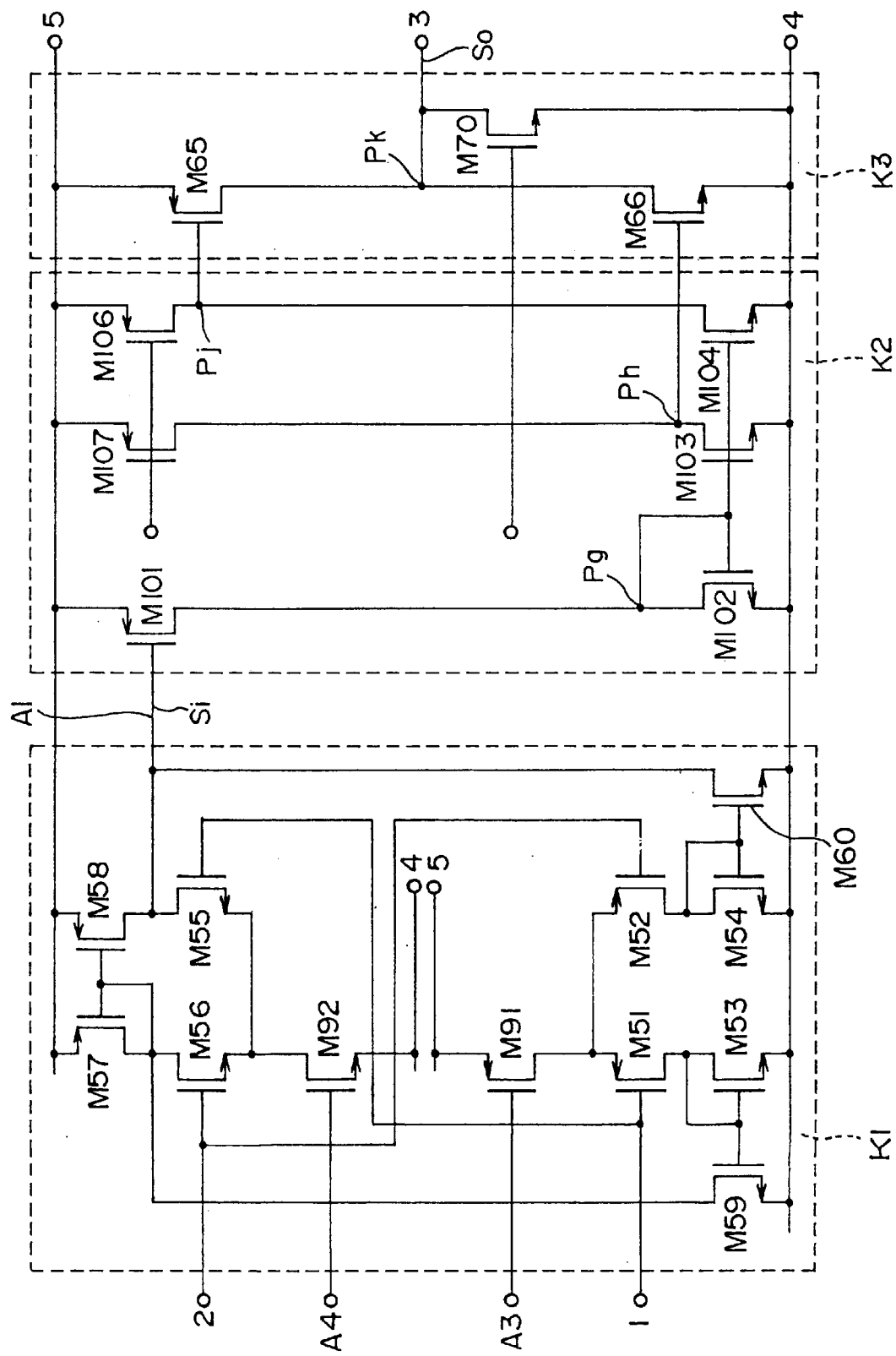
F I G. 5

OPERATIONAL AMPLIFIER

BACKGROUND OF THE INVENTION

1. Field of the Invention

The present invention relates to an operational amplifier, and more particularly to an operational amplifier capable of suppressing occurrence of overshoot or undershoot to the minimum.

2. Description of the Prior Art

As an operational amplifier which can handle input and output in a wide range and drive a large load, up to now, there has been a technique disclosed in Japanese Patent Publication No.Hei 9-93,055 by the present inventors.

An operational amplifier disclosed in Japanese Patent Publication No.Hei 9-93,055 is described with reference to FIG. 10. The operational amplifier is provided with an input stage K1, a driving stage K2 and an output stage K3.

First, the composition of the input stage K1 of the operational amplifier is described. The input stage K1 of the operational amplifier is provided with P channel field effect transistors (FETs) M1 and M2, N channel FETs M5 and M6, a P channel FET for constant current source M41, an N channel FET for constant current source M42, N channel FETs M3 and M9, N channel FETs M4 and M10, and P channel FETs M7 and M8. The P channel FETs M1 and M2, whose sources are commonly connected to each other and whose gates are respectively to signal input terminals 1 and 2, form a differential transistor couple. The N channel FETs M5 and M6, whose sources are commonly connected to each other and whose gates are respectively to signal input terminals 1 and 2, form a differential transistor couple. The P channel FET for constant current source M41 is connected between the sources of the P channel FETs M1 and M2 commonly connected to each other and a high level side power source terminal 5.

The N channel FET for constant current source M42 is connected between the sources of the N channel FETs M5 and M6 commonly connected to each other and a low level side power source terminal 4. In the N channel FET M3, its gate and drain are connected to the drain of the P channel FET M1 and its source is connected to the low level side power source terminal 4. In an N channel FET M9, its drain is connected to the connection point of the drain of the N channel FET M6 and the drain of the P channel FET M7, and its source is connected to the low level side power source terminal 4. The N channel FETs M3 and M9 form a first current mirror circuit. In an N channel FET M4, its drain and gate are connected to the drain of the P channel FET M2 and its source is connected to the low level side power source terminal 4.

In an N channel FET M10, its drain is connected to the connection point of the drain of the N channel FET M5 and the drain of the P channel FET M8, and its source is connected to the low level side power source terminal 4.

The N channel FETs M4 and M10 form a second current mirror circuit. The P channel FETs M7 and M8 are connected respectively between the drain of the N channel FET M6 and the high level side power source terminal 5 and between the drain of the N channel FET M5 and the high level side power source terminal 5.

The P channel FETs M7 and M8 form a current mirror circuit for acting as an active load.

Next, the composition of the driving stage K2 of the operational amplifier is described.

The driving stage K2 of the operational amplifier is provided with P channel FETs M20, M21 and M22, and N channel FETs for constant current power source M43 and M44.

The N channel FETs for constant current source M43 and M44 both have their sources connected to the low level side power source terminal 4. The N channel FETs for constant current source M43 and M44 both are of a current-intake type.

In the P channel FET M20, its source is connected to the high level side power source terminal 5, its gate is connected to the connection point of the drain of the N channel FET M5 and the drain of the P channel FET M8, and its drain is connected to the drain of the N channel FET for constant current power source M43. In the P channel FET M21, its source is connected to the high level side power source terminal 5, its gate is connected to the drain of the P channel FET M20, and its drain is connected to the gate of the P channel FET M22. In the P channel FET M22, its source is connected to the high level side power source terminal 5, its gate is connected to the connection point of the drain of the P channel FET M20 and the drain of the P channel FET M21, and its drain is connected to the drain of the N channel FET for constant current power source M44. Next, the composition of the output stage K3 of the operational amplifier is described.

The output stage K3 of the operational amplifier is provided with a P channel FET M23 and an N channel FET M24. In the P channel FET M23, its source is connected to the high level side power source terminal 5, its gate is connected to the connection point of the drain of the N channel FET M5 and the drain of the P channel FET M8, and its drain is connected to the output signal terminal 3. In the N channel FET M24, its source is connected to the low level side power source terminal 4, its gate is connected to the connection point of the drain of the P channel FET M22 and the drain of the N channel FET for constant current power source M44, and its drain is connected to the output signal terminal 3.

Next, operation of the operational amplifier shown in FIG. 10 is described. The operational amplifier shown in FIG. 10 has the input stage K1 of a wide input range made by connecting in parallel with each other a differential transistor couple composed of the P channel FETs M1 and M2 and a differential transistor couple composed of the N channel FETs M5 and M6. The operational amplifier changes the gate voltage of the P channel FET M23 according to the ratio of signal voltages respectively applied to the signal input terminals 1 and 2. And a signal passing through the P channel FETs M20, M21 and M22 changes the gate voltage of the N channel FET M24. The potential of the output signal terminal 3 is quickly raised or dropped according to variation quantities of the respective gate voltages of the P channel FET M23 and the N channel FET M24.

First, the case where a voltage applied to the signal input terminal 1 is higher than a voltage applied to the signal input terminal 2 is described. The voltage of the connection point of the drain of the N channel FET M5, the drain of the P channel FET M8 and the drain of the N channel FET M10, namely, the gate voltage of the P channel FETs M20 and M23 becomes low. At this time, an electric current which flows from the high level side power source terminal 5 through the P channel FET M23 to the output signal terminal 3 becomes large. And at this time, the voltage of the connection point of the drain of the P channel FET M20 and the drain of the N channel FET for constant current power source M43, namely, the gate voltage of the P channel FETs M21 and M22 becomes high. Hereupon, the voltage of the connection point of the drain of the P channel FET M22 and the drain of the N channel FET for constant current power source M44, namely, the gate voltage of the N channel FET M24 becomes low.

At this time, an electric current flowing from the output signal terminal 3 through the M channel FET M24 to the low level side power source terminal 4 becomes very small. That is to say, since an electric current flowing through the N channel FET M24 is in a shutoff state, an electric current flowing from the high level side power source terminal 5 through the P channel FET M23 can quickly raise the potential of the output signal terminal 3 by flowing to the output signal terminal 3 (when charging).

On the other hand, the case where a voltage applied to the signal input terminal 1 is lower than a voltage applied to the signal input terminal 2 is described. The voltage of the connection point of the drain of the N channel FET M5, the drain of the P channel FET M8 and the drain of the N channel FET M10, namely, the gate voltage of the P channel FETs M20 and M23 becomes high.

At this time, an electric current which flows from the high level side power source terminal 5 through the P channel FET M23 to the output signal terminal 3 becomes very small. And at the same time as this, the voltage of the connection point of the drain of the P channel FET M20 and the drain of the N channel FET for constant current power source M43, namely, the gate voltage of the P channel FETs M21 and M22 becomes low. Hereupon, the voltage of the connection point of the drain of the P channel FET M22 and the drain of the N channel FET for constant current power source M44, namely, the gate voltage of the N channel FET M24 becomes high. At this time, an electric current flowing from the output signal terminal 3 through the N channel FET M24 to the low level side power source terminal 4 becomes large. At this time, an electric current flowing from the output signal terminal 3 through the N channel FET M24 to the low level side power source terminal 4 is shut off. That is to say, it is possible to quickly lower the potential of the output signal terminal 3 by making a large electric current flow from the output signal terminal 3 through the N channel FET M24 to the low level side power source terminal 4 (when discharging). Furthermore, this operational amplifier can provide the output stage K3 of a wide output range which can output the potential of the output signal terminal 3 ranging from a potential lowered by the voltage between the drain and source of the P channel FET M23 from the high level side power source terminal 5 to a potential raised by the voltage between the drain and source of the N channel FET M24 from the low level side power source terminal 4.

And when the potential of the output signal terminal 3 is lowered, the gate potential of the P channel FET M23 and the gate potential of the P channel FET M20 both rise, but since the drain of the P channel FET M20 is connected to the N channel FET for constant current power source M43, a through current corresponding to a discharging current does not flow. Since an idling current to flow through the P channel FET M23 and the N channel FET M24 in a balanced state (in a state where the potential of the output signal terminal 3 has reached a target potential) is determined by the ratio in transistor size of the P channel FET M20 to the P channel FET M23 and the N channel FET for constant current power source M43, variation of a threshold value does not influence the idling current.

As described above, the operational amplifier of FIG. 10 has a wide input range and a wide output range and can quickly raise or lower the potential of the output signal terminal 3, and its idling current is not influenced by the absolute variation in threshold value of transistors and said operational amplifier can suppress occurrence of a through current according to a discharging current to flow inside it at the time of discharging. According to the composition of FIG. 10, up to now, there has been a problem that the P channel FET M23 and the N channel FET M24 are different from each other in amplification factor and transfer delay of input signals since the input signals pass through different transfer paths.

That is to say, the P channel FET M23 has a signal inputted directly from the input stage output terminal A1. On the other hand, the N channel FET M24 has a signal of the input stage output terminal A1 inputted through the P channel FETs M20, M21 and M22.

Accordingly, when comparing the P channel FET M23 and the N channel FET M24 with each other in input timing of an input signal from the input stage output terminal A1, the N channel FET M24 has a more delayed signal inputted. And when comparing the P channel FET M23 and the N channel FET M24 with each other in amplification factor of an input signal from the input stage output terminal A1, the N channel FET M24 has a more greatly amplified signal inputted than a signal inputted to the P channel FET M23 due to a fact that the former is inputted through the P channel FETs M20, M21 and M22.

Particularly at the time of discharging, there has been a problem that since an input signal to the N channel FET M24 is more delayed in input timing and is more greatly amplified than a signal inputted to the P channel FET M23, the time of releasing the N channel FET M24 from a shutoff state is delayed and no current flows through the N channel FET M24 during the period of delay and therefore an overshoot phenomenon is liable to occur.

An overshoot or undershoot phenomenon in waveform outputted to the output signal terminal 3 has been sometimes caused by difference in delay time and amplification factor between inputted signals.

In case of using such an operational amplifier as described above as a LCD driver for example, a plurality of operational amplifiers corresponding to the number of pixels of the LCD is needed. In this case the LCD screen sometimes becomes irregular in display quality due to a fact that the respective operational amplifiers are different from one another in occurrence or magnitude of overshoot or undershoot.

BRIEF SUMMARY OF THE INVENTION

1. OBJECTS OF THE INVENTION

An object of the present invention is to provide an operational amplifier capable of suppressing occurrence of overshoot or undershoot to the minimum and performing a stable operation.

2. SUMMARY OF THE INVENTION

An operational amplifier of the present invention is an operational amplifier comprising an output stage (K2, K3) for outputting an output signal (So) in response to an input signal (Si), wherein said output stage (K2, K3) performs a push-pull operation in response to each of a plurality of specific signals (S1 and S2) generated on the basis of said input signal (Si) and have a plurality of output stage transistors (M65 and M66) which generate said output signal (So) as a result of said push-pull operation, and said plurality of specific signals (S1 and S2) are generated as signals being substantially equal to each other in delay time until they are inputted respectively to said plurality of output stage transistors (M65 and M66).

In said operational amplifier of the present invention, said plurality of specific signals (S1 and S2) comprise a first specific signal (S1) and a second specific signal (S2) and each of said first and second specific signals (S1 and S2) is generated by generation transistors (M61, M62, M63 and M64) of one stage or two or more stages, and the number of stages of said generation transistors (M61, M62 and M64) for generating said first specific signal (S1) and the number of stages of said generation transistors (M61, M62 and M63) for generating said second specific signal (S2) are equal to each other.

An operational amplifier of the present invention comprises an input stage (K1) and an output stage (K2, K3) for outputting an output signal (So) in response to an input stage output signal (Si) outputted from said input stage (K1), wherein said output stage (K2, K3) performs a push-pull operation in response to each of a plurality of specific signals (S1 and S2) generated on the basis of said input stage output signal (Si) and have a plurality of output stage transistors (M65 and M66) which generate said output signal (So) as a result of said push-pull operation, and said plurality of specific signals (S1 and S2) are generated as signals being equal to each other in delay time until they are inputted respectively to said plurality of output stage transistors (M65 and M66).

An operational amplifier of the present invention comprises;

first and second differential transistor couples (M51, M52, and M55, M56) of inversely conductive types to each other whose control electrodes are connected respectively to first and second input terminals (1 and 2), first and second constant current sources (M91 and M92) being connected respectively to said first and second differential transistor couples (M51, M52, and M55, M56), a first current mirror circuit (M53, M59) being connected between one output terminal (M51a) of said first differential transistor couple (M51, M52) and a first power source terminal (4) and between one output terminal (M56a) of said second differential transistor couple (M55, M56) and the first power source terminal (4), a second current mirror circuit (M54, M60) being connected between the other output terminal (M52a) of said second differential transistor couple (M55, M56) and said first power source terminal (4) and between the other output terminal(M55a) of said second differential transistor couple (M55, M56) and said first power source terminal (4), a load circuit (M57, M58) being connected between said second differential transistor couple (M55, M56) and a second power source terminal (5), a first transistor (M61) whose control electrode is connected to the connection point (Pa) of said other output terminal (M55a) of said second differential transistor couple (M55, M56) and said load circuit (M57, M58), and which is connected between said first power source terminal (4) and said second power source terminal (5), a third constant current source (M67) being connected in series with said first transistor (M61) between said first power source terminal (4) and said second power source terminal (5), a second transistor (M62) whose control electrode is connected to the connection point (Pb) of said first transistor (M61) and said third constant current source (M67), and which is connected between the connection point (Pb) of said first transistor (M61) and said third constant current source (M67), and said second power source terminal (5), a third transistor (M63) whose control electrode is connected to the connection point (Pb) of said first transistor (M61) and said third constant current source (M67), and which is connected between said first power source terminal (4) and said second power source terminal (5), a fourth constant current source (M68) being connected in series with said third transistor (M63) between said first power source terminal (4) and said second power source terminal (5), a fourth transistor (M64) whose control electrode is connected to the connection point (Pb) of said first transistor (M61) and said third constant current source (M67), and which is connected between said first power source terminal (4) and said second power source terminal (5), a fifth constant current source (M69) being connected in series with said fourth transistor (M64) between said first power source terminal (4) and said second power source terminal (5), and first and second output transistors (M65 and M66) which are connected in series with each other between said first power source terminal (4) and said second power source terminal (5) and whose control electrodes are connected respectively to the connection point (Pc) of said fourth transistor (M64) and said fifth constant current source (M69) and the connection point (Pd) of said third transistor (M63) and said fourth constant current source (M68), wherein; the connection point (Pe) of said first and second output transistors (M65 and M66) is connected to an output terminal (3). An operational amplifier of the present invention comprises;

first and second differential transistor couples (M51, M52, and M55, M56) of inversely conductive types to each other whose control electrodes are connected respectively to first and second input terminals (1 and 2), first and second constant current power sources (M91 and M92) being connected respectively to said first and second differential transistor couples (M51, M52, and M55, M56), a first current mirror circuit (M53, M59) being connected between one output terminal (M51a) of said first differential transistor couple (M51, M52) and a first power source terminal (4) and between one output terminal (M56a) of said second differential transistor couple (M55, M56) and the first power source terminal (4), a second current mirror circuit (M54, M60) being connected between the other output terminal (M52a) of said second differential transistor couple (M55, M56) and said first power source terminal (4) and between the other output terminal(M55a) of said second differential transistor couple (M55, M56) and said first power source terminal (4), a load circuit (M57, M58) connected between said second differential transistor couple (M55, M56) and a second power source terminal (5), a first transistor (M101) whose control electrode is connected to the connection point (Pa) of said other output terminal (M55a) of said second differential transistor couple (M55, M56) and said load circuit (M57, M58), and whose first electrode is connected to said second power source terminal (5), a third current mirror circuit (M102, M103) having its input terminal (Pg) connected to the second electrode of said first transistor (M101), a third constant current source (M107) being connected between the output terminal (Ph) of said third current mirror circuit (M102, M103) and said second power source terminal (5), a second transistor (M104) whose control electrode is connected to said input terminal (Pg) of said third current mirror circuit (M102, M103) and which is connected between said first power source terminal (4) and said second power source terminal (5), a fourth constant current source (M106) being connected in series with said second transistor (M104) between said first power source terminal (4) and said second power source terminal (5), and first and second output transistors (M65 and M66) which are connected in series with each other between said first power source terminal (4) and said second power source terminal (5) and whose control electrodes are connected respectively to the connection point (Pj) of said fourth constant current source (M106) and said second transistor (M104), and the output terminal (Ph) of said third current mirror circuit (M102, M103); and the connection point (Pk) of said first and second output transistors (M65 and M66) is connected to an output terminal (3).

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 shows the circuit composition of an operational amplifier according to a first embodiment of the present invention, FIG. 3 shows the circuit composition of an operational amplifier according to a third embodiment of the present invention, FIG. 5 shows the circuit composition of an operational amplifier according to a fifth embodiment of the present invention.

DETAILED DESCRIPTION OF THE INVENTION

Figure 11:
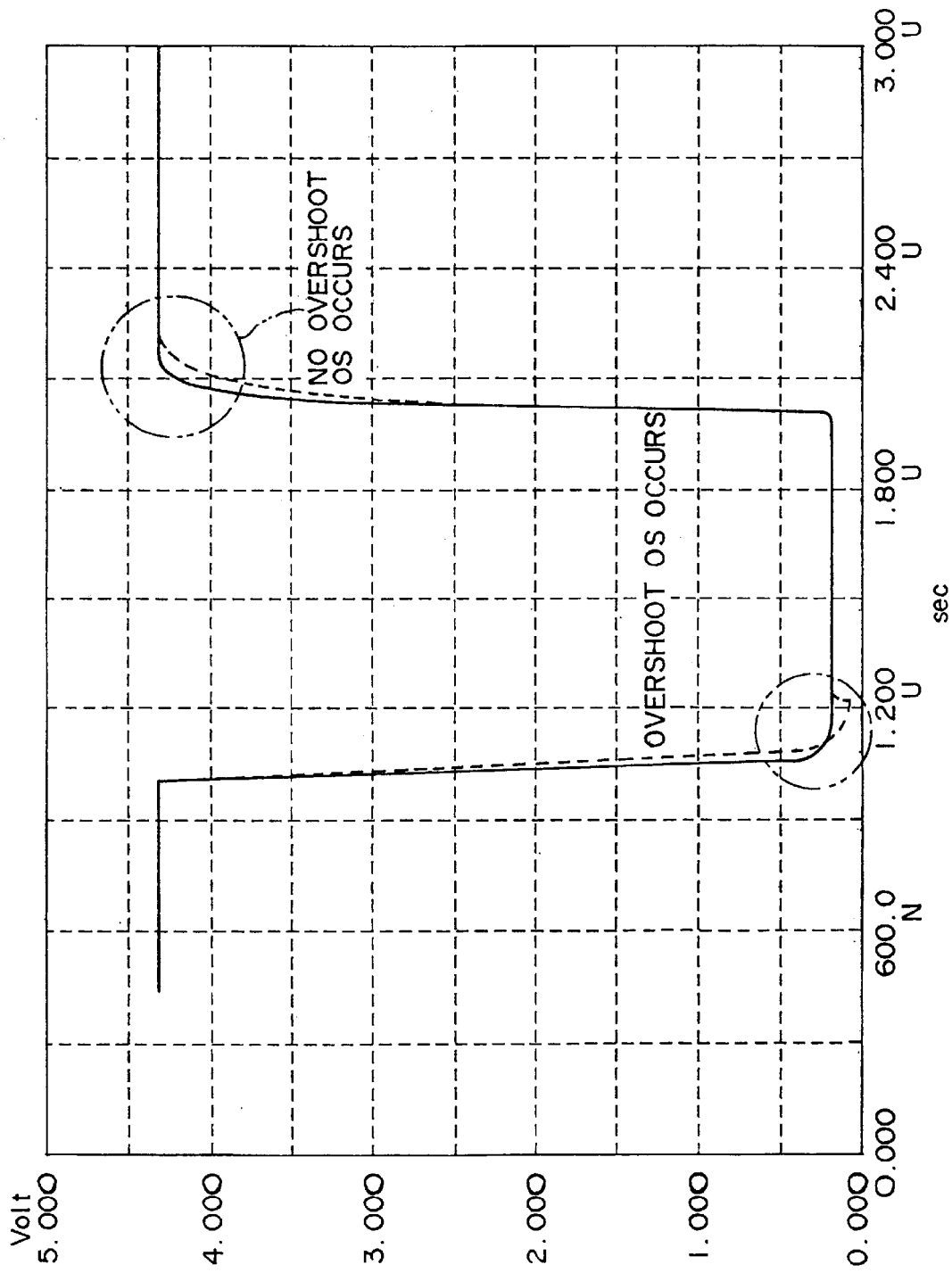
FIG. 11 is a graph showing the respective output waveforms of the operational amplifier according to the first embodiment of the present invention and the operational amplifier of the prior art.
Figure 12:
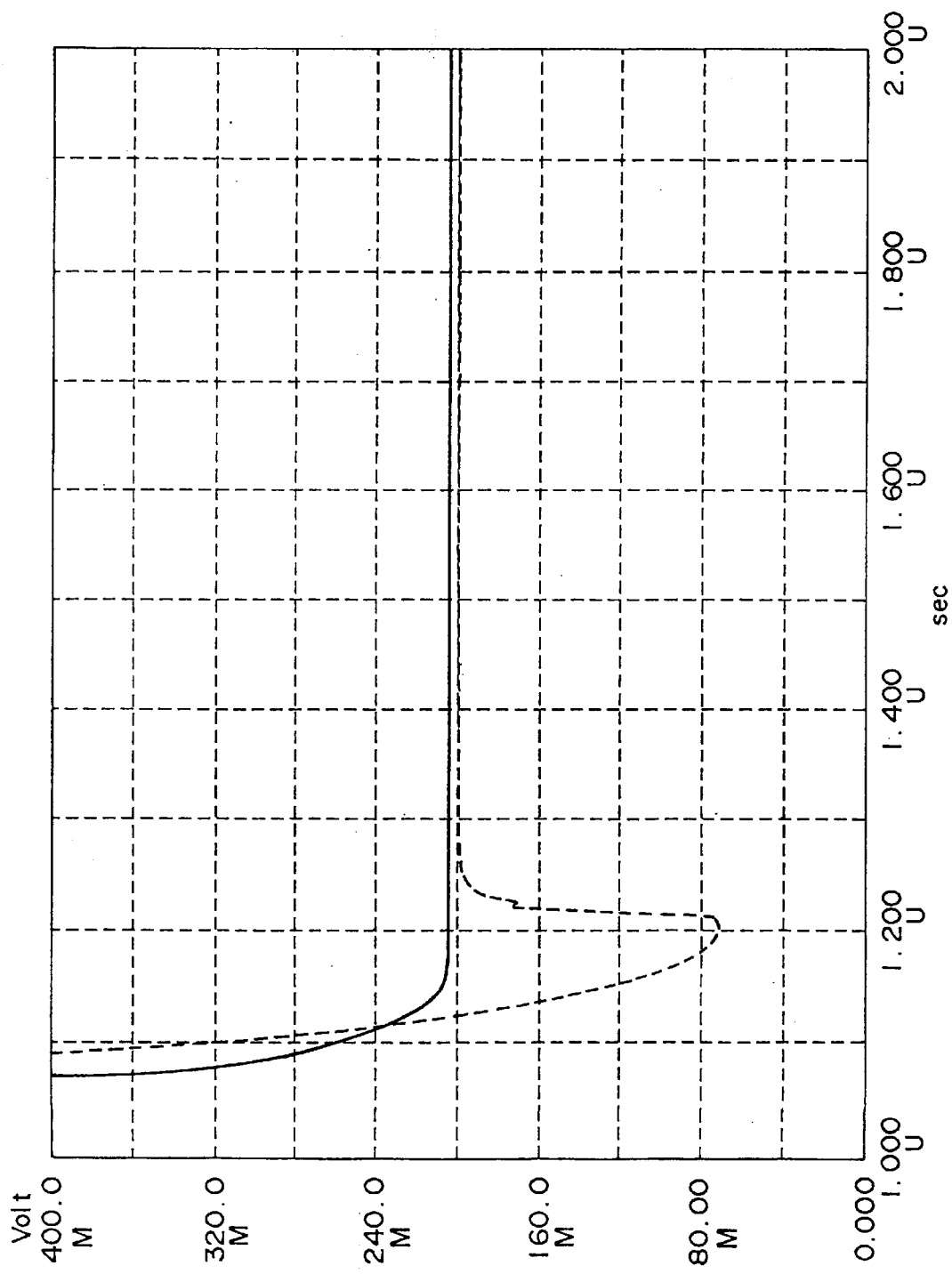
FIG. 12 is a magnified view of part of FIG. 11, which shows that undershoot is detected in a former operational amplifier but is not detected in the operational amplifier of the first embodiment.
Figure 13:
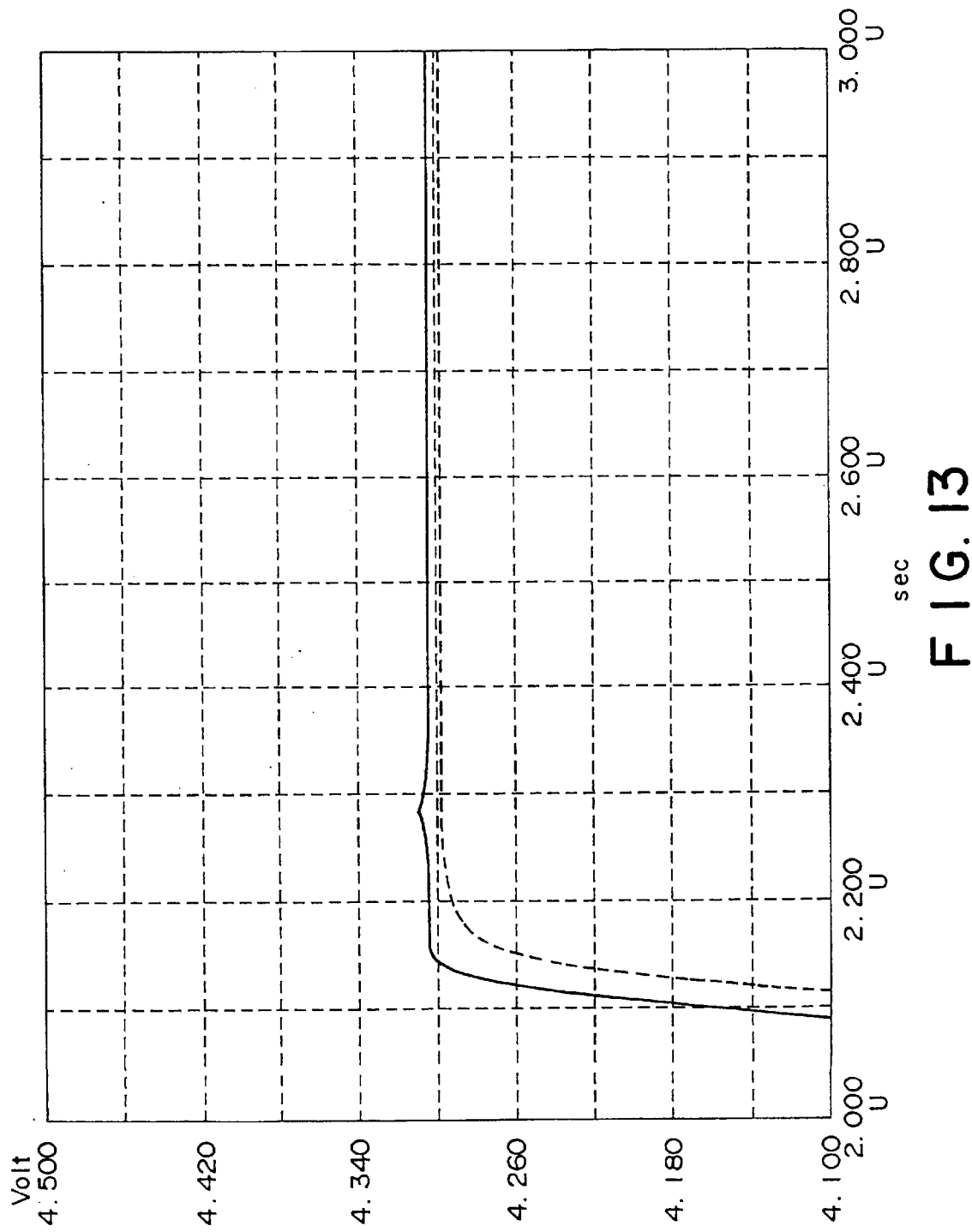
FIG. 13 is a magnified view of part of FIG. 11, which shows that overshoot is not detected in the former operational amplifier and the operational amplifier of the first embodiment.

An embodiment of an operational amplifier of the present invention is described with reference to the accompanying drawings in the following. An object of operational amplifiers according to first to ninth embodiments is to suppress an undershoot or overshoot phenomenon as shown in FIGS. 11 to 13 to the minimum. In FIGS. 11 to 13, waveforms shown by solid lines correspond to these embodiments and waveforms shown by dashed lines correspond to the prior art shown in FIG. 10. An example shown in FIGS. 11 and 12 shows that an undershoot US is detected in an operational amplifier of the prior art but is not detected in these embodiments. In an example shown in FIG. 13, an overshoot OS is not detected in either of the operational amplifier of the prior art and the operational amplifiers of these embodiments.

FIG. 1 shows the circuit composition of an operational amplifier according to the first embodiment. An operational amplifier according to the first embodiment comprises an input stage K1, a driving stage K2 and an output stage K3.

First, the composition of the input stage K1 of the operational amplifier is described. The input stage K1 of the operational amplifier is provided with P channel field effect transistors (FETs) M51 and M52, N channel FETs M55 and M56, a P channel FET for constant current source M91, an N channel FET for constant current source M92, N channel FETs M53 and M59, N channel FETs M54 and M60, and P channel FETs M57 and M58.

The P channel FETs M51 and M52, in which their sources are commonly connected to each other and their gates are respectively to signal input terminals 1 and 2, form a differential transistor couple.

The N channel FETs M55 and M56, in which their sources are commonly connected to each other and their gates are respectively to signal input terminals 1 and 2, form a differential transistor couple.

The P channel FET for constant current source M91 is connected between the sources of the P channel FETs M51 and M52 commonly connected to each other and a high level side power source terminal 5.

The N channel FET for constant current source M92 is connected between the sources of the N channel FETs M55 and M56 commonly connected to each other and a low level side power source terminal 4. In the P channel FET for constant current source M91 and the N channel FET for constant current source M92, their gates are connected respectively to input stage bias input terminals A3 and A4. In the N channel FET M53, its gate and drain are connected to the drain of the P channel FET M51 and its source is connected to the low level side power source terminal 4. In an N channel FET M59, its drain is connected to the connection point of the drain of the N channel FET M56 and the drain of the P channel FET M57, and its source is connected to the low level side power source terminal 4.

The N channel FETs M53 and M59 form a first current mirror circuit. In the N channel FET M54, its drain and gate are connected to the drain of the P channel FET M52 and its source is connected to the low level side power source terminal 4. In the N channel FET M60, its drain is connected to the connection point of the drain of the N channel FET M55 and the drain of the P channel FET M58, and its source is connected to the low level side power source terminal 4. The N channel FETs M54 and M60 form a second current mirror circuit.

The P channel FETs M57 and M58 are connected respectively between the drain of the N channel FET M56 and the high level side power source terminal 5 and between the drain of the N channel FET M55 and the high level side power source terminal 5.

The P channel FETs M57 and M58 form a current mirror circuit to act as an active load.

Next, the composition of the driving stage K2 of the operational amplifier is described.

The driving stage K2 of the operational amplifier is provided with P channel FETs M61, M62, M63 and M64, and N channel FETs for constant current power source M67, M68 and M69.

Each of the N channel FETs for constant current source M67, M68 and M69 has its source connected to the low level side power source terminal 4, and has its gate connected to a driving stage bias input terminal A5. The N channel FETs for constant current source M67, M68 and M69 each are of a current-intake type.

The gate of the P channel FET M61 is connected to the connection point of the drain of the P channel FET M58 and the drain of the N channel FET M55.

The sources of the P channel FETs M61 and M62 both are connected to the high level side power source terminal 5, and their drains are commonly connected to each other. The common connection point of these drains is connected to the gate of the P channel FET M62 and connected to the drain of the P channel FET for constant current source M67. The P channel FETs M63 and M64 have their sources connected to the high level side power source terminal 5 and their gates connected to said common connection point of the drains of the P channel FETs M61 and M62. The drain of the P channel FET M63 is connected to the drain of the N channel FET for constant current source M68.

The drain of the P channel FET M64 is connected to the drain of the N channel FET for constant current source M69.

Next, the composition of the output stage K3 of the operational amplifier is described.

The output stage K3 of the operational amplifier is provided with a P channel FET M65, an N channel FET M66 and an N channel FET for constant current source M70. In the P channel FET M65, its source is connected to the high level side power source terminal 5, its gate is connected to the drain of the P channel FET M64 and its drain is connected to an output signal terminal 3.

In the N channel FET M66, its source is connected to the low level side power source terminal 4, its gate is connected to the connection point of the drain of the P channel FET M63 and the drain of the N channel FET for constant current source M68, and its drain is connected to the output signal terminal 3.

In the N channel FET for constant current source M70, its source is connected to the low level side power source terminal 4, its gate is connected to said driving stage bias input terminal A5, and its drain is connected to the output signal terminal 3.

Next, operation of the operational amplifier shown in FIG. 1 is described.

The operational amplifier shown in FIG. 1 has the input stage K1 of a wide input range made by connecting in parallel with each other a differential transistor couple composed of the P channel FETs M51 and M52 and a differential transistor couple composed of the N channel FETs M55 and M56.

The operational amplifier changes the gate voltage of the P channel FET M65 and the gate voltage of the N channel FET M66 according to the ratio of signal voltages respectively applied to the signal input terminals 1 and 2. The potential of the output signal terminal 3 is quickly raised or lowered according to variation quantities of the respective gate voltages of the P channel FET M65 and the N channel FET M66. First, the case where a voltage applied to the signal input terminal 1 is higher than a voltage applied to the signal input terminal 2 is described.

The voltage of the connection point of the drain of the N channel FET M55, the drain of the P channel FET M58 and the drain of the N channel FET M60, namely, the gate voltage of the P channel FET M61 becomes low.

At this time, the gate voltage of the P channel FETs M62 and M64 becomes high and the gate voltage of the P channel FET M65 becomes low. Due to this, an electric current which flows from the high level side power source terminal 5 through the P channel FET M65 to the output signal terminal 3 becomes large.

And at this time, the gate voltage of the N channel FET M66 becomes low. Due to this, since an electric current flowing through the N channel FET M66 from the output signal terminal 3 to the low level side power source terminal 4 is in a shutoff state, an electric current flowing from the high level side power source terminal 5 through the P channel FET M65 can quickly raise the potential of the output signal terminal 3 by flowing to the output signal terminal 3 (when charging).

On the other hand, the case where a voltage applied to the signal input terminal 1 is lower than a voltage applied to the signal input terminal 2 is described. The voltage of the connection point of the drain of the N channel FET M55, the drain of the P channel FET M58 and the drain of the N channel FET M60, namely, the gate voltage of the P channel FET M61 be comes high. At this time, the gate voltage of the P channel FETs M62 and M64 becomes low and the gate voltage of the P channel FET M65 becomes high. Due to this, an electric current which flows from the high level side power source terminal 5 through the P channel FET M65 to the output signal terminal 3 becomes very small.

And at this time, the gate voltage of the N channel FET M66 becomes high. Due to this, an electric current flowing from the output signal terminal 3 through the N channel FET M66 to the low level side power source terminal 4 becomes large. At this time, an electric current flowing from the high level side power source terminal 5 through the P channel FET M65 to the output signal terminal 3 is shut off. That is to say, it is possible to quickly lower the potential of the output signal terminal 3 by making a large electric current flow from the output signal terminal 3 through the N channel FET M66 to the low level side power source terminal 4 (when discharging).

Furthermore, this operational amplifier can provide the output stage K3 of a wide output range which can output the potential of the output signal terminal 3 ranging from a potential lowered by the voltage between the drain and source of the P channel FET M65 from the high level side power source terminal 5 to a potential raised by the voltage between the drain and source of the N channel FET M66 from the low level side power source terminal 4.

And when the potential of the output signal terminal 3 is lowered, the gatepotential of the P channel FET M65 and the gate potential of the P channel FETs M63 and M64 rise at the same time, but since the drains of the P channel FETs M63 and M64 are connected respectively to the N channel FETs for constant current power source M68 and M69, a through current corresponding to a discharging current does not flow.

Furthermore, in this embodiment the transistor stages in the driving stage K2 side in case of being seen from the P channel FET M65 and the N channel FET M66 of the output stage K3 are equal in number to each other. That is to say, a signal inputted to the gate of the P channel FET M61 (input signal Si) is inputted to the gate of the P channel FET M63 and the gate of the P channel FET M64 in a state where said input signal is inverted by the P channel FET M62. Here, a signal inputted to each of the gates of the P channel FETs M63 and M64 is a single signal (hereinafter referred to as signal Sa).

Signal Sa is inputted through the P channel FET M64 to the gate of the P channel FET M65 (this inputted signal is set as a first specific signal S1). And signal Sa is inputted through the P channel FET M63 to the gate of the N channel FET M66 (this inputted signal is set as a second specific signal S2). Thus, the number of transistor stages in the driving stage K2 side is one and the same in either of cases of being seen from the P channel FET M65 and from the N channel FET M66.

Figure 10:
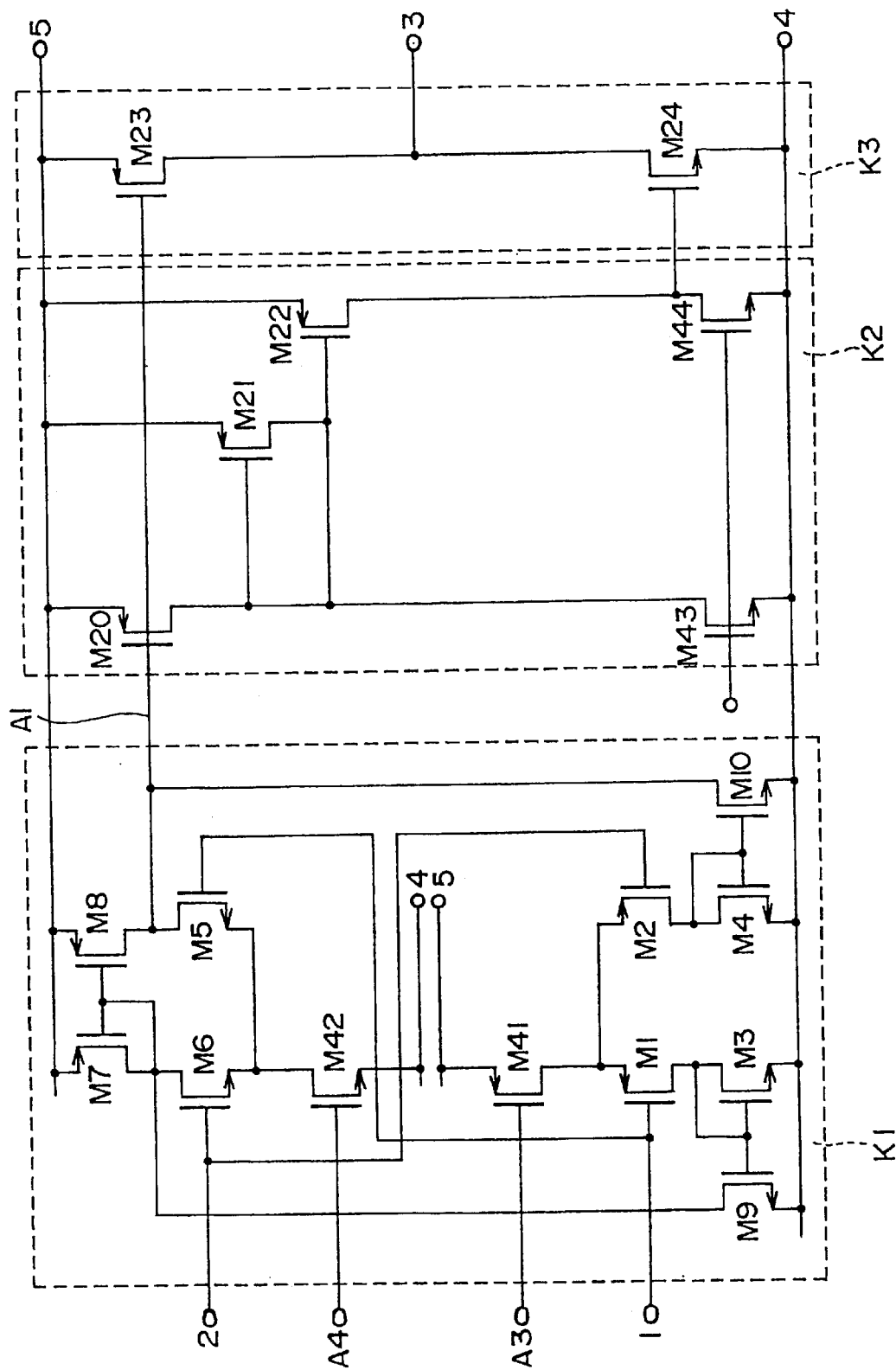
FIG. 10 shows the circuit composition of an operational amplifier according to the prior art.

Thanks to this, it is possible to solve a problem of delay in signal input timing and difference in amplification factor as described in the prior art of FIG. 10. By adopting a circuit composition as shown in FIG. 1, therefore, it is possible to suppress occurrence of undershoot or overshoot to the minimum and also suppress occurrence of variation in undershoot or overshoot in case of using a plurality of operational amplifiers of the present embodiment. Hereupon, an idling current flowing through the P channel FET M65 and the N channel FET M66 in a balanced state (where the potential of the output signal terminal 3 has reached a target potential) is described.

The P channel FET M65 and the N channel FET M66 do not have such a constant current source as the N channel FETs for constant current source M67 to M69. Therefore, how to determine an idling current and attain a good push-pull operation becomes a problem.

In this case, concretely, it is assumed that the values of electric currents which are to flow through the N channel FETs for constant current source M67 to M70 are set respectively as 30 $\mu$A, 10 $\mu$A, 10 $\mu$A and 10 $\mu$A. And it is assumed that the ratio in size of the P channel FETs M62 to M64 is "1:1:2".

In a balanced state, the voltage between the gate and drain of the P channel FET M62 and the gate potential of the P channel FETs M63 and M64 are determined by the value of current flowing through the N channel FET for constant current source M69 and the transistor size of the P channel FET M64. These are described in detail in the following.

Since an electric current to flow through the P channel FET for constant current source M69 is 10 $\mu$A, an electric current to flow through the P channel FET M64 is also 10 $\mu$A. The voltage Vgs between the gate and source of the P channel FET M64 is determined on such a voltage that limits a current flowing through the N channel FET for constant current source M69 to 10 $\mu$A.

Since the gate of the P channel FET M64 and the gate of the P channel FET M63 are connected to each other, the voltage between the gate and source of the P channel FET M63 becomes equal to the voltage Vgs between the gate and source of the P channel FET M64.

Since the gate of the P channel FET M62 is also connected to the gates of the P channel FET M64 and the P channel FET M63, the voltage between the gate and drain of the P channel FET M62 also becomes equal to said voltage Vgs between the gate and source of the P channel FET M64. Hereupon, since the ratio in transistor size of the P channel FETs M62 to M64 has been determined as described above, the values of currents to flow through the P channel FETs M61 to M64 in a balanced state are respectively as follows.

P channel FET M61 =25 $\mu$A,
P channel FET M62 =5 $\mu$A,
P channel FET M63 =5 $\mu$A, and
P channel FET M64 =10 $\mu$A.

Hereupon, since the transistor ratio of the P channel FET M63 to the P channel FET M64 is "1:2", an electric current of only 5 $\mu$A flows through the P channel FET M63. The N channel FET for constant current source M68 is a current source for letting a current of 10 $\mu$A flow, but a current supplied from the P channel FET M63 to the N channel FET for constant current source M68 is 5 $\mu$A.

Therefore, the N channel FET for constant current source M68 operates out of a saturation area, the voltage Vds of the drain and source of the N channel FET for constant current source M68 is slipped out from the saturation area and is lowered to a value corresponding to 5 $\mu$A. When the voltage Vds of the drain and source of the N channel FET for constant current source M68 is lowered as described above, the gate voltage of the N channel FET M66 connected to the drain of the N channel FET for constant currentsource M68 is lowered. Due to this, the N channel FET M66 becomes high in resistance and comes into the off state where only a very small current can flow.

As described above, the N channel FET for constant current source M68 is out of a saturation area and the N channel FET M66 is in a state where only a very small current can flow. Due to this, an idling current of the output stage K3 is determined by the N channel FET for constant current source M70. Now, since the N channel FET for constant current source M70 lets a current of 10 $\mu$A flow, the idling current becomes 10 $\mu$A. Next, a function of the N channel FET for constant current source M70 is described. A case where after the N channel FET for constant current source M68 has been slipped out from the saturation area and the N channel FET M66 has become high in resistance as described above, the output signal terminal 3 is charged and this charging process is finished and the charged capacitance element comes into a saturated state is thought. In this case, when there is not the N channel FET for constant current source M70, the gate potential of the P channel FET M65 rises.

When the gate potential of the P channel FET M65 rises to a fixed value or higher, this P channel FET M65 comes into a high-resistance state where only a very small current can flow. At this time, since the N channel FET M66 has been already in a high-resistance state, it is thought that it becomes impossible to provide and use a voltage follower in an operational amplifier of the present embodiment so as to perform a feedback operation.

That is to say, if both of the P channel FET M65 and the N channel FET M66 of the output stage K3 come into the off state where an electric current little flows when a charging process is finished, a feedback operation cannot be performed, and therefore it is necessary to determine the operating point of the output stage K3 and make the circuit stably operate.

By providing the N channel FET for constant current source M70, a path along which an electric current passing through the P channel FET M 65 (an idling current) flows is secured after the charging of the output signal terminal 3 is finished. Thanks to this, it is possible to prevent the gate potential of the P channel FET M65 from rising and prevent the P channel FET M65 from coming into a high-resistance state (off state). Since there has not been a state where a path along which an idling currentflows comes not to exist in such a circuit composition as that of the prior art where undershoot or overshoot occurs, the N channel FET for constant current source M70 having such a function as described above has been unnecessary. In the present embodiment, since the transistor stages provided respectively before the P channel FET M65 and the N channel FET M66 of the output stage K3 are made equal in number to each other and such a ratio in transistor size as described is set among these transistors, it has become necessary to secure a path along which an idling current flows (the N channel FET for constant current source M70). Next, a charging operation and a discharging operation in the present embodiment is described.

Electric currents flowing respectively through the P channel FETs M61 to M64 in a balanced state are as follows in the same way as described above.

P channel FET M61 =25 μA,
P channel FET M62 =5 μA,
P channel FET M63 =5 μA, and
P channel FET M62 =10 μA.

First, operation in discharging is described. In discharging, the potential of said input stage output terminal A1 inputted to said driving stage K2 from said input stage K1 rises higher than the potential in a balanced state. In other words, most of a current of 25 μA which has flowed through the P channel FET M61 comes to flow to the P channel FET M62 side.

The transistor size ratio of ""P channel FET M62":"P channel FET M63":"P channel FET M64"" is "1:1:2".

Therefore, the gate potential of the P channel FET M63 is lowered to a gatepotential to let a current of 10 μA or more flow through the P channel FET M63. The gate potential of the P channel FET M64 is also lowered to a gate potential to let a current of 10 μA or more flow through the P channel FET M64.

Since the N channel FET for constant current source M68 and the N channel FET for constant current source M69 each are a constant current source of 10 μA, however, the respective gate potentials of the P channel FET M65 and the N channel FET M66 finally rise higher than the potential in a balanced state. Through the above-mentioned operation, the P channel FET M65 comes into the off state (high-resistance state) and the N channel FET M66 comes into the on state (a state where a more current flows), and a discharging operation from the output signal terminal 3 to the low level side power source terminal 4 is started.

Next, operation in charging is described. In charging, the potential of the input stage output terminal A1 inputted to said driving stage K2 from said input stage K1 drops lower than an ordinary potential. In other words, a current of almost 30 μA flows through the P channels FET M61. Therefore, currents flowing respectively through the P channel FETs M63 and M64 also become nearly 0 μA.

Figure 2:
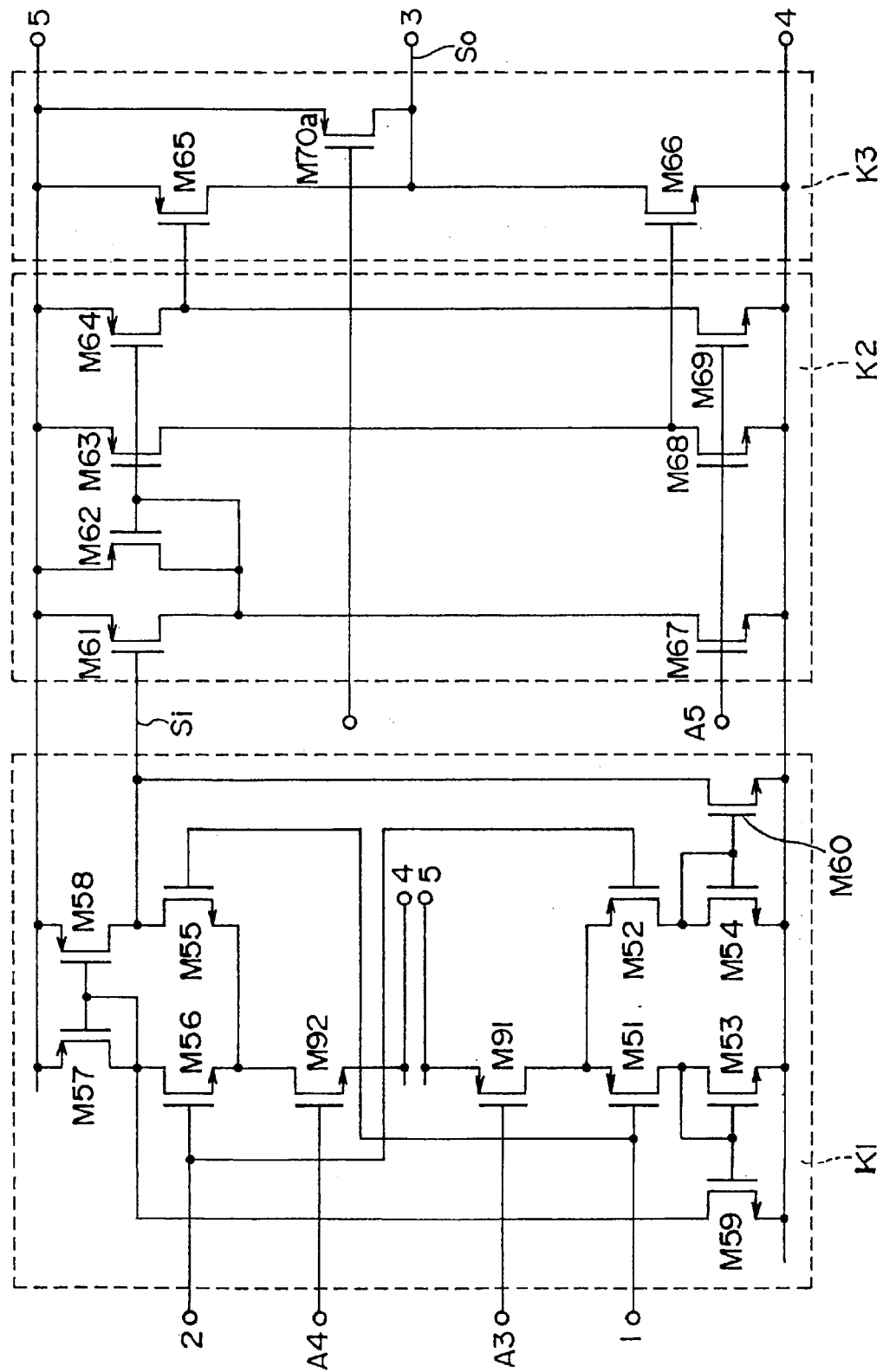
FIG. 2 shows the circuit composition of an operational amplifier according to a second embodiment of the present invention.

Since the N channel FETs for constant current source M68 and M69 each are a constant current source of 10 μA, however, the potentials of the respective gate electrodes of the P channel FET M65 and the N channel FET M66 drop lower than the potentials in a balance state. Through the above-mentioned operation, the P channel FET M65 comes into the on state and the N channel FET M66 comes into the off state, and a charging operation is started. FIG. 2 is a circuit diagram showing the composition of an operational amplifier according to a second embodiment of the present invention.

In FIG. 2, the same elements as or the corresponding elements to the elements of FIG. 1 showing the composition of said first embodiment are given the same reference symbols as the symbols of FIG. 1 and detailed description of them is omitted. The second embodiment is different from said first embodiment in that said N channel FET for constant current source M70 connected to the low level side power source terminal 4 side is replaced with a P channel FET for constant currentsource M70a connected to the high level side power source terminal 5 side. As described above, the N channel FET for constant current source M70 of said first embodiment prevents the P channel FET M65 from coming into the off state when both of the N channel FET M66 and the N channel FET for constant current source M68 come into the off state. On the other hand, the P channel FET for constant current source M70a of the second embodiment prevents the N channel FET M66 from coming into the off state when both of the P channel FET M64 and the P channel FET M65 come into the off state.

The operational amplifier of this embodiment is substantially the same as that of said first embodiment only except that the P channel FET for constant current source M70a has been changed in position. Therefore, description of its operation is omitted.

Figure 4:
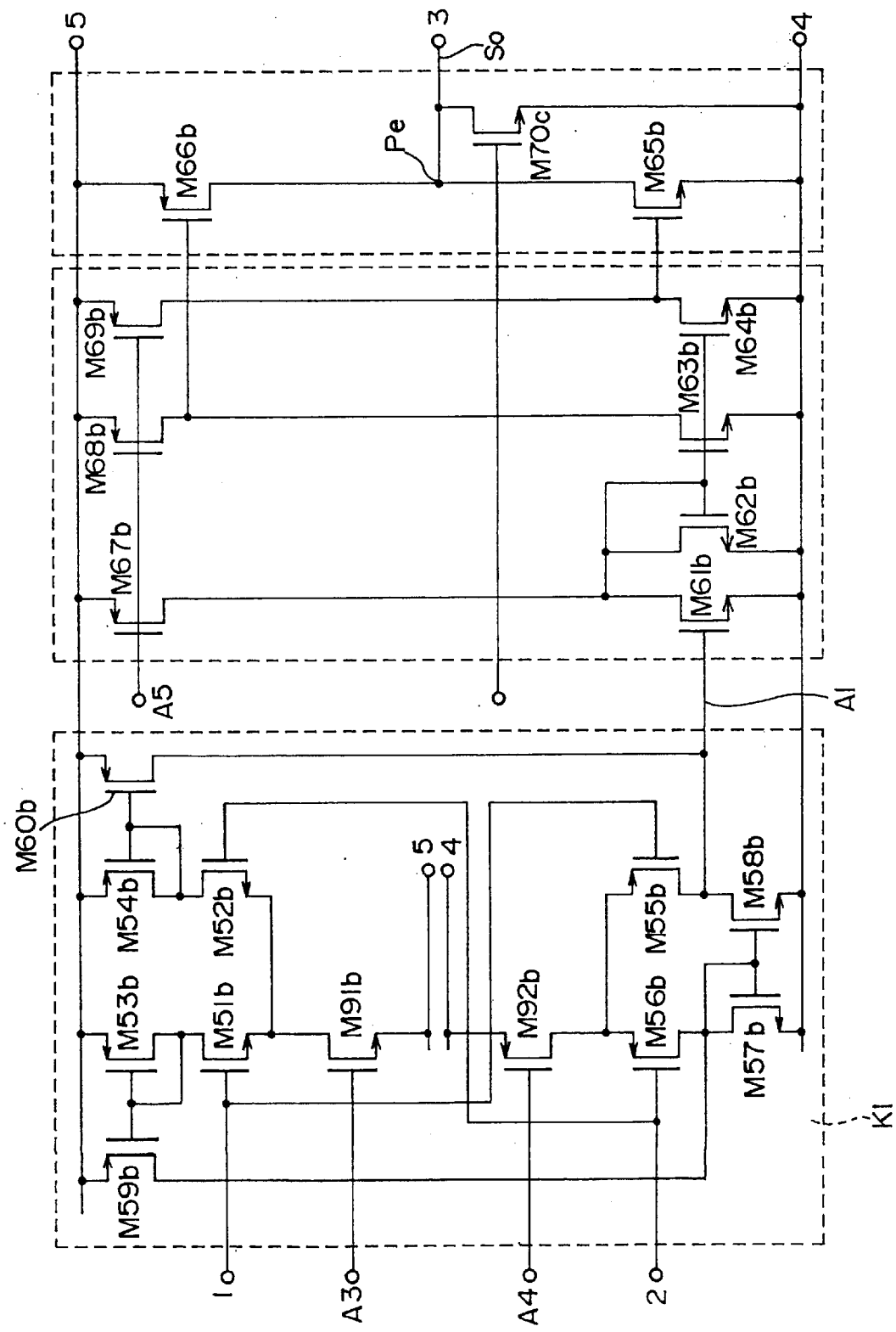
FIG. 4 shows the circuit composition of an operational amplifier according to a fourth embodiment of the present invention.

FIG. 3 is a circuit diagram showing the composition of an operational amplifier according to a third embodiment of the present invention. In FIG. 3, the same elements as or the corresponding elements to the elements of FIG. 1 showing the composition of said first embodiment are given the same reference symbols as the symbols of FIG. 1 and detailed description of them is omitted. The third embodiment is different from said first embodiment in that said low level side power source terminal 4 side and said high level side power source terminal 5 side in said first embodiment have been inverted to each other. That is to say, the P channel FETs M51, M52, M57, M58, M61, M62, M63, M64 and M65 are replaced with N channel FETs M51b, M52b, M57b, M58b, M61b, M62b, M63b, M64b and M65b, and the N channel FETs M53, M54, M55, M56, M59, M60, M66, M67, M68, M69 and M70 are replaced with P channel FETs M53b, M54b, M55b, M56b, M59b, M60b, M66b, M67b, M68b, M69b and M70b. The operational amplifier of this embodiment is substantially the same as that of said first embodiment only except that its circuit has been inverted in polarity. Therefore, description of its operation is omitted. FIG. 4 is a circuit diagram showing the composition of an operational amplifier according to a fourth embodiment of the present invention. In FIG. 4, the same elements as or the corresponding elements to the elements of FIG. 3 showing the composition of said third embodiment are given the same reference symbols as the symbols of FIG. 3 and detailed description of them is omitted. The fourth embodiment is different from said third embodiment in that the P channel FET for constant current source M70b connected to said high level side power source terminal 5 side in said third embodiment is replaced with an N channel FET for constant current source M70c connected to said low level side power source terminal 4 side. The operational amplifier of this embodiment is substantially the same as that of said second embodiment. Therefore, description of its operation is omitted.

FIG. 5 is a circuit diagram showing the composition of an operational amplifier according to a fifth embodiment of the present invention. In FIG. 5, the same elements as or the corresponding elements to the elements of FIG. 1 showing the composition of said first embodiment are given the same reference symbols as the symbols of FIG. 1 and detailed description of them is omitted. In the fifth embodiment a P channel FET M101 acts as an inverting transistor for inverting an output signal from a differential transistor couple of the input stage K1, and an N channel FET M102 and an N channel FET M103 which form a current mirror circuit invert again and output the signal inverted by the N channel FET M101. Hereupon, concretely, it is assumed that currents flowing through P channel FETs for constant current source M106 and M107, and an N channel FET for constant current source M70 each are 10 $\mu$A. And it is assumed that the ratio in transistor size of the N channel FETs M102, M103 and M104 is "1:2:1". In a balanced state, the voltages Vgs between the gates and sources of the N channel FETs M104, M103 and M102 are determined by the transistor size of the N channel FET M104 and the value of a current flowing through the P channel FET for constant current source M106.

Therefore, the N channel FET M103 attempts to let a current of 20 $\mu$A flow and the N channel FET M102 attempts to let a current of 10 $\mu$A flow. However, since the P channel FET for constant current source M107 lets a current of only 10 $\mu$flow, the voltage Vds between the drain and source of the N channel FET M103 is determined on a value corresponding to a current of only 10 $\mu$A. Due to this, the voltage of the drain electrode of the N channel FET M103, namely, the voltage of the gate electrode of the N channel FET M66 is lowered. Due to this, the N channel FET M66 becomes high in resistance and comes into the off state where only a very small current can flow, namely, comes into a state where only a very small current can flow.

Therefore, an idling current of the output stage K3 is determined by the N channel FET for constant current source M70. Now, the N channel FET for constant current source M70 has an idling current of 10 $\mu$A in order to let a current of 10 $\mu$A flow.

Figure 6:
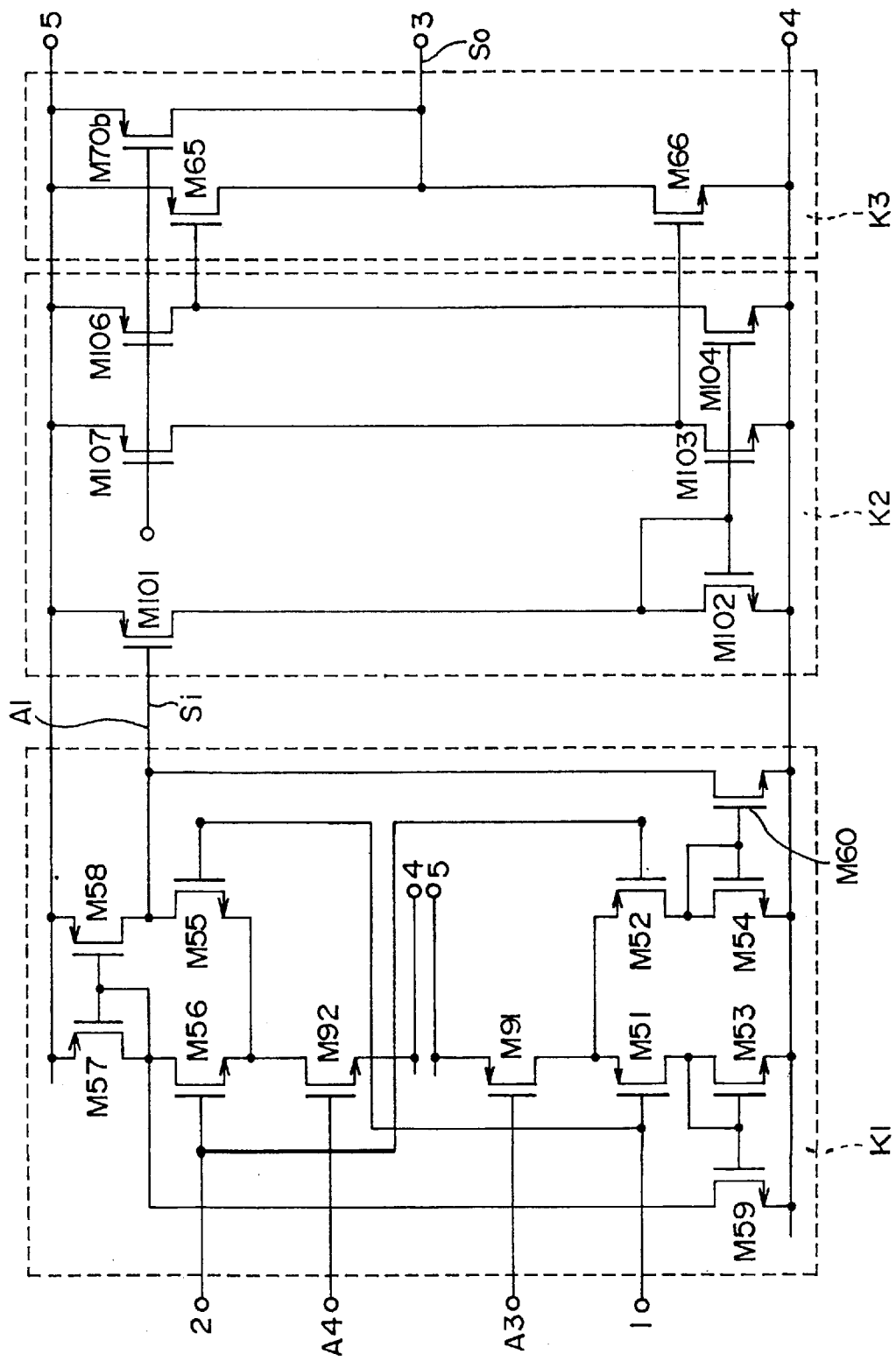
FIG. 6 shows the circuit composition of an operational amplifier according to a sixth embodiment of the present invention.

FIG. 6 is a circuit diagram showing the composition of an operational amplifier according to a sixth embodiment of the present invention. In FIG. 6, the same elements as or the corresponding elements to the elements of FIG. 1 showing the composition of said first embodiment are given the same reference symbols as the symbols of FIG. 1 and detailed description of them is omitted. The sixth embodiment is different from said fifth embodiment in that the N channel FET for constant current source M70 in said fifth embodiment is replaced with a P channel FET for constant current source M70b provided at said high level side power source terminal 5 side.

Figure 7:
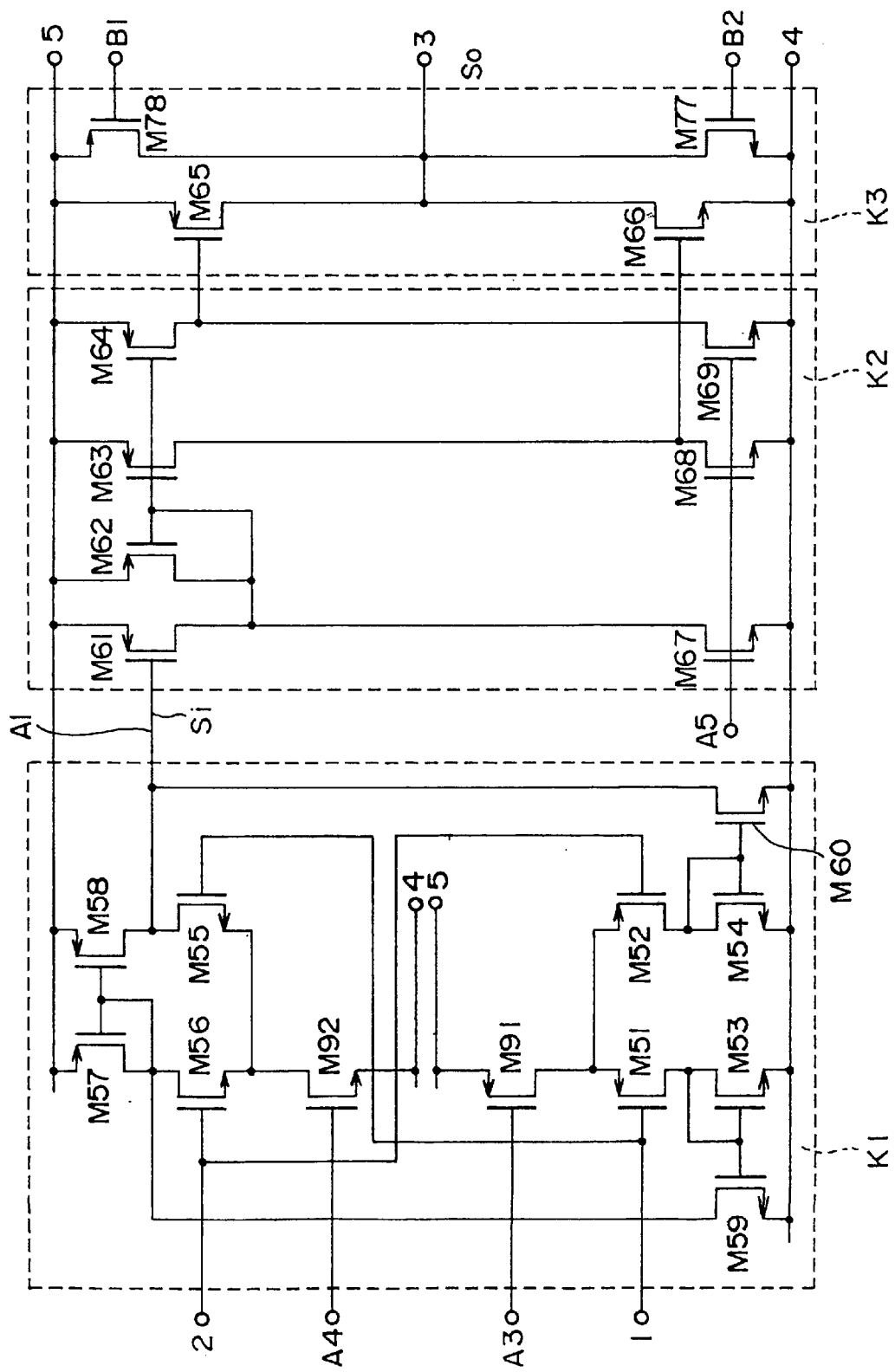
FIG. 7 shows the circuit composition of an operational amplifier according to a seventh embodiment of the present invention.

FIG. 7 is a circuit diagram showing the composition of an operational amplifier according to a seventh embodiment of the present invention. In FIG. 7, the same elements as or the corresponding elements to the elements of FIG. 1 showing the composition of said first embodiment are given the same reference symbols as the symbols of FIG. 1 and detailed description of them is omitted. In FIG. 7, an N channel FET for constant current source M77 corresponds to the N channel FET for constant current source M70 in said first embodiment. The seventh embodiment is different from said first embodiment in that a P channel FET for constant current source M78 is newly provided in the output stage K3. When a signal for raising the gate potential of the P channel FET M61 of said driving stage K2 is inputted from the input stage output terminal A1 of said input stage K1 (when charging), a bias is inputted to an output stage bias input terminal B2 and said N channel FET for constant current source M77 is brought into the on state where a current can flow and said P channel FET for constant current source M78 is brought into the off state where a current can little flow. On the other hand, when a signal for lowering the gate potential of the P channel FET M61 of said driving stage K2 is inputted from said input stage output terminal A1 (when discharging), a bias is inputted to an output stage bias input terminal B1 and said P channel FET for constant current source M78 is brought into the on state where a current can flow and said N channel FET for constant current source M77 is brought into the off state where a current can little flow. Due to this, it is possible to more improve the balance at the time of charging and discharging in comparison with said first embodiment and suppress distortion in waveform outputted from the output signal terminal 3 to the minimum.

Figure 8:
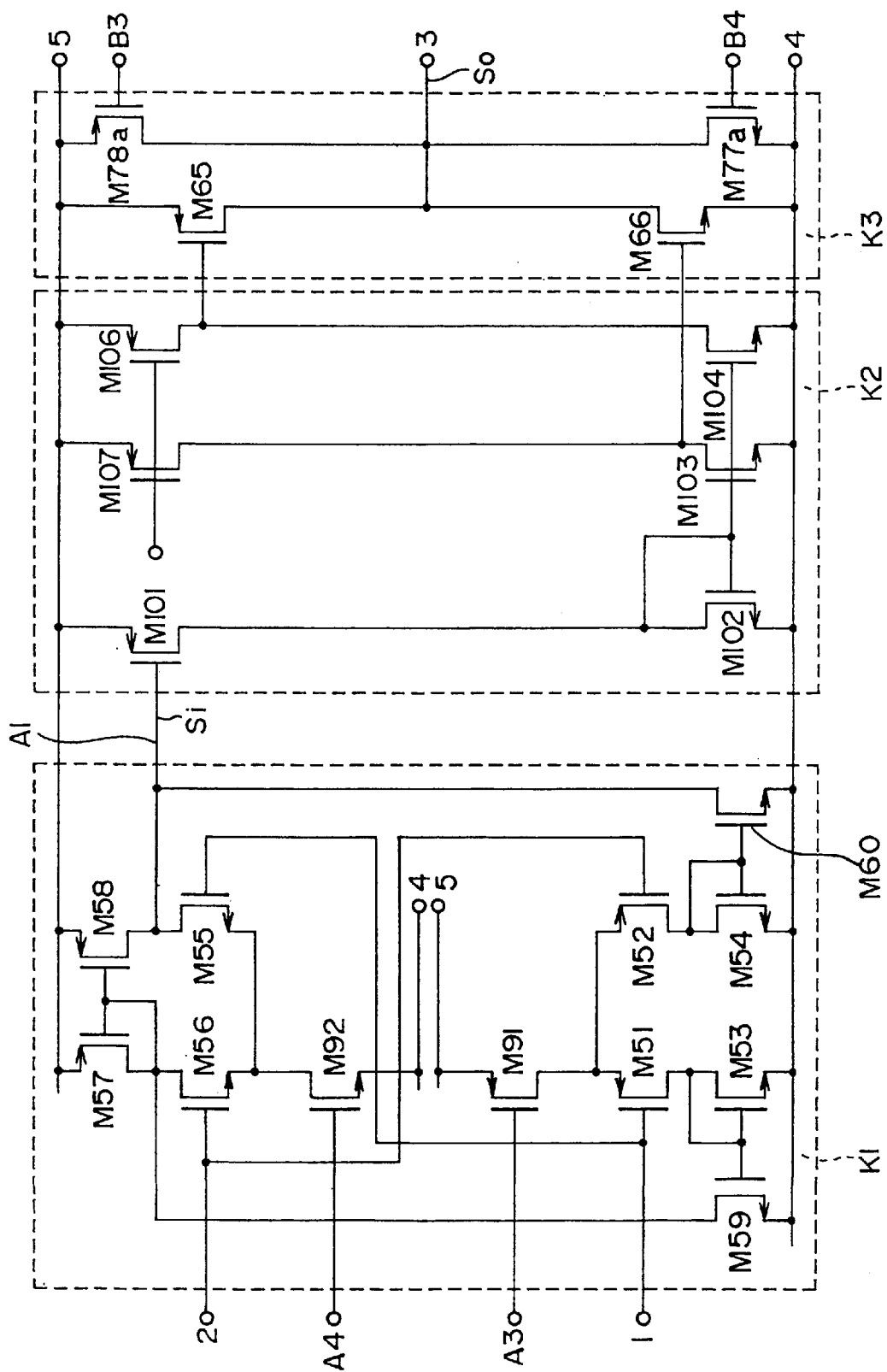
FIG. 8 shows the circuit composition of an operational amplifier according to an eighth embodiment of the present invention.

FIG. 8 is a circuit diagram showing the composition of an operational amplifier according to an eighth embodiment of the present invention. In FIG. 8, the same elements as or the corresponding elements to the elements of FIG. 1 showing the composition of said first embodiment are given the same reference symbols as the symbols of FIG. 1 and detailed description of them is omitted. The eighth embodiment adopts the ideas in said fifth, sixth and seventh embodiments.

Figure 9:
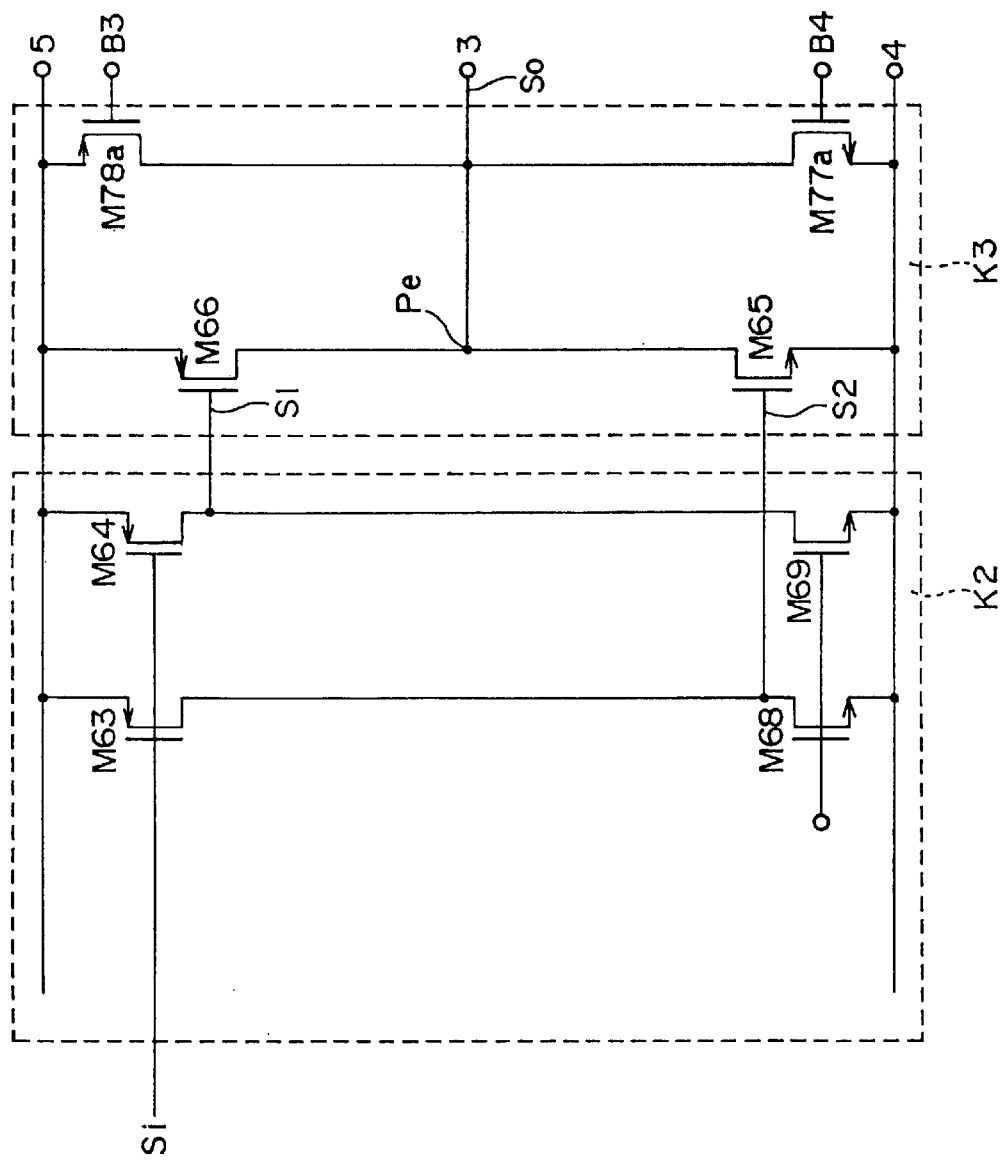
FIG. 9 shows the circuit composition of an operational amplifier according to a ninth embodiment of the present invention.

When charging, a bias is inputted to an output stage bias input terminal B4 and an N channel FET for constant current source M77a is brought into the on state where a current can flow and a P channel FET for constant current source M78a is brought into the off state where a current can little flow. On the other hand, when discharging, a bias is inputted to an output stage bias input terminal B3 and said P channel FET for constant current source M78a is brought into the on state where a current can flow and said N channel FET for constant current source M77a is brought into the off state where a current can little flow. Due to this, it is possible to more improve the balance at the time of charging and discharging in comparison with said first embodiment and suppress distortion in waveform outputted from the output signal terminal 3 to the minimum. FIG. 9 is a diagram simply showing one of points of the present invention.

As shown in FIG. 9, a ninth embodiment is an operational amplifier provided with output stages K2 and K3 for outputting an output signal So in response to an input signal Si. Said output stages K2 and K3 perform a push-pull operation respectively in response to a plurality (two in this example) of specific signals S1 and S2 generated on the basis of said input signal Si, and have a plurality of output stage transistors M65 and M66 for generating said output signal So as a result of said push-pull operation. Said plurality of specific signals S1 and S2 are generated as signals being equal to each other in delay time until they are inputted respectively into said plurality of output stage transistors M65 and M66 (as signals having no difference in delay time).

Said first and second specific signals S1 and S2 are generated respectively by generation transistors M63 and M64 for amplifying said input signal Si, the number of stages of said generation transistor M64 for generating said first specific signal S1 is one, and the number of stages of said generation transistor M63 for generating said second specific signal S2 is one and these transistors have the same number of stages.

The ninth embodiment further comprises a sixth constant current source M77 aconnected between the connection point Pe of said first and second output transistors M65 and M66, and said first power source terminal 4, and still further comprises a seventh constant current source M78a connected between said connection point Pe and said second power source terminal 5. Said first to ninth embodiments use FETs as transistors, but may use bipolar transistors in place of the FETs. The N channel FETs can be replaced with NPNbipolar transistors and the P channel FETs can be replaced with PNP bipolar transistors.

Since this composition has no difference in function as an operational amplifier between the case of FETs and the case of bipolar transistors, its basic operation as an operational amplifier is the same as said first to ninth embodiments. Since generally a bipolar transistor is larger in mutual conductance than a FET, this composition can obtain a large gain than said first to ninth embodiments. Thanks to this, a high-accuracy operational amplifier can be obtained. And since generally a bipolar transistor is larger in mutual conductance than a FET, its fall time can become smaller than that of a FET. In said first to ninth embodiments, the FETs for constant current source M70, M70a, M70b, M70c, M77, M78, M77a and M78a have been used as a means for letting an idling current flow through said output stage K3. A means for letting an idling current flow through said output stage K3 is not limited to these transistors for constant current source M70 and the like but may be load resistors. Byconnecting such load resistors as resistance elements R and the like in place of said N channel FETs for constant current source M70 and the like, it is possible to prevent all of the plurality of output stage transistors M65 and M66 from coming into a high-resistance state or the off state at the same time and prevent generation of an output signal So to be outputted from said output signal terminal 3 from being stopped. In case that said load resistors are provided, however, the value of an idling current of the output stage K3 is changed by an output voltage (output signal So) of the output signal terminal 3. In case of attempting to set the value of an idling current at a fixed value, therefore, it is preferable to use transistors for constant current source in the same way as said first to ninth embodiments instead of using said load resistors.

An operational amplifier of the present invention is an operational amplifier provided with an output stage for outputting an output signal in response to an input signal, in which said output stage performs a push-pull operation respectively in response to a plurality of specific signals generated on the basis of said input signal and has a plurality of output stage transistors for generating said output signal as a result of said push-pull operation, and said plurality of specific signals are generated as signals being equal to each other in delay time until they are inputted respectively into said plurality of output stage transistors, and therefore said operational amplifier can perform such a stable operation that can suppress occurrence of overshoot or undershoot to the minimum. Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An operational amplifier comprising an output stage for outputting an output signal in response to an input signal, wherein;

said output stage performs a push-pull operation respectively in response to a plurality of specific signals generated on the basis of said input signal and has a plurality of output stage transistors for generating said output signal as a result of said push-pull operation, and said plurality of specific signals are generated as signals being substantially equal to each other in delay time until said plurality of specific signals are inputted respectively into said plurality of output stage transistors, said output stage is provided with a specific signal generating means for generating said plurality of specific signals on the basis of said input signal, and an output stage having said plurality of output stage transistors, wherein; said specific signal generating means is provided with;

a first transistor which has a control electrode to have said input signal inputted and which is connected between a first power source terminal and a second power source terminal, a first constant current source connected in series with said first transistor between said first power source terminal and said second power source terminal, a second transistor whose control electrode is connected to the connection point of said first transistor and said first constant current source, and which is connected between the connection point of said first transistor and said first constant current source, and said second power source terminal, a third transistor whose control electrode is connected to the connection point of said first transistor and said first constant current source, and which is connected between said first power source terminal and said second power source terminal, a second constant current source connected in series with said third transistor between said first power source terminal and said second power source terminal, a fourth transistor whose control electrode is connected to the connection point of said first transistor and said first constant current source, and which is connected between said first power source terminal and said second power source terminal, and a third constant current source connected in series with said fourth transistor between said first power source terminal and said second power source terminal.

2. An operational amplifier according to claim 1, wherein; said output stage is provided with first and second output stage transistors of said output transistors which first and second output stage transistors are connected in series with each other between said first power source terminal and said second power source terminal, and whose control electrodes are connected respectively to the connection point of said fourth transistor and said third constant power source, and to the connection point of said third transistor and said second constant power source, and the connection point of said first and second output stage transistors is connected to an output terminal to which said output signal is outputted.

3. An operational amplifier according to claim 2, wherein; said output stage further comprises a fourth constant current source connected between said connection point of said first and second output transistors, and said first power source terminal.

4. An operational amplifier according to claim 3, wherein; said output stage further comprises a fifth constant current source connected between said connection point of said first and second output transistors, and said second power source terminal.

5. An operational amplifier comprising an output stage for outputting an output signal in response to an input signal, wherein;

said output stage performs a push-pull operation respectively in response to a plurality of specific signals generated on the basis of said input signal and has a plurality of output stage transistors for generating said output signal as a result of said push-pull operation, and said plurality of specific signals are generated as signals being substantially equal to each other in delay time until said plurality of specific signals are inputted respectively into said plurality of output stage transistors, said output stage is provided with a specific signal generating means for generating said plurality of specific signals on the basis of said input signal, and an output stage having said plurality of output stage transistors, wherein; said specific signal generating means is provided with;

a first transistor which has a control electrode to have said input signal inputted and whose first electrode is connected to a second power source terminal, a first current mirror circuit whose input terminal is connected to a second electrode of said first transistor, a first constant current source connected between an output terminal of said first current mirror circuit and said second power source terminal, a second transistor whose control electrode is connected to said input terminal of said first current mirror circuit and which is connected between said first power source terminal and said second power source terminal, and a second constant current source connected in series with said second transistor between said first power source terminal and said second power source terminal.

6. An operational amplifier according to claim 5, wherein; said output stage is provided with first and second output stage transistors of said output stage transistors which first and second output stage transistors are connected in series with each other between said first power source terminal and said second power source terminal, and whose control electrodes are connected respectively to the connection point of said second constant current source and said second transistor, and to the output terminal of said first current mirror circuit, and the connection point of said first and second output stage transistors is connected to the output terminal to which said output signal is outputted.

7. An operational amplifier according to claim 6, wherein; said output stage further comprises a third constant current power source connected between said connection point of said first and second output stage transistors and said first power source terminal.

8. An operational amplifier according to claim 7, wherein; said output stage further comprises a fourth constant current power source connected between said connection point of said first and second output stage transistors and second power source terminal.

9. An operational amplifier comprising;

first and second differential transistor couples of inversely conductive types to each other whose control electrodes are connected respectively to first and second input terminals, first and second constant current sources being connected respectively to said first and second differential transistor couples, a first current mirror circuit being connected between one output terminal of said first differential transistor couple and a first power source terminal and between one output terminal of said second differential transistor couple and the first power source terminal, a second current mirror circuit being connected between the other output terminal of said first differential transistor couple and said first power source terminal and between the other output terminal of said second differential transistor couple and said first power source terminal, a load circuit being connected between said second differential transistor couple and the second power source terminal, a first transistor whose control electrode is connected to the connection point of said other output terminal of said second differential transistor couple and said load circuit, and which is connected between said first power source terminal and said second power source terminal, a third constant current source being connected in series with said first transistor between said first power source terminal and said second power source terminal, a second transistor whose control electrode is connected to the connection point of said first transistor and said third constant current source, and which is connected between the connection point of said first transistor and said third constant current source, and said second power source terminal, a third transistor whose control electrode is connected to the connection point of said first transistor and said third constant current source, and which is connected between said first power source terminal and said second power source terminal, a fourth constant current source being connected in series with said third transistor between said first power source terminal and said second power source terminal, a fourth transistor whose control electrode is connected to the connection point of said first transistor and said third constant current source, and which is connected between said first power source terminal and said second power source terminal, a fifth constant current source being connected in series with said fourth transistor between said first power source terminal and said second power source eterminal, and first and second output transistors which are connected in series with each other between said first power source terminal and said second power source terminal and whose control electrodes are connected respectively to the connection point of said fourth transistor and said fifth constant current source and to the connection point of said third transistor and said fourth constant current source, wherein;

the connection point of said first and second output transistors is connected to an output terminal.

10. An operational amplifier according to claim 9, further comprising;

a sixth constant current source connected between the connection point of said first and second output transistors, and said first power source terminal.

11. An operational amplifier according to claim 10, wherein; said third to sixth constant current sources each are composed of a transistor for constant current source, and the control electrodes of said transistors for constant current source are applied respectively with bias voltages being equal to each other.

12. An operational amplifier according to claim 11, further comprising;

a seventh constant current source connected between the connection point of said first and second output transistors, and said second power source terminal.

13. An operational amplifier comprising;

first and second differential transistor couples of inversely conductive types to each other whose control electrodes are connected respectively to first and second input terminals, first and second constant current sources being connected respectively to said first and second differential transistor couples, a first current mirror circuit being connected between one output terminal of said first differential transistor couple and a first power source terminal and between one output terminal of said second differential transistor couple and the first power source terminal, a second current mirror circuit being connected between the other output terminal of said first differential transistor couple and said first power source terminal and between the other output terminal of said second differential transistor couple and the first power source terminal, a load circuit being connected between said second differential transistor couple and the second power source terminal, a first transistor whose control electrode is connected to the connection point of said other output terminal of said second differential transistor couple and said load circuit, and whose first electrode is connected to said second power source terminal, a third current mirror circuit having its input terminal connected to a second electrode of said first transistor, a third constant current source being connected between an output terminal of said third current mirror circuit and said second power source terminal, a second transistor whose control electrode is connected to said input terminal of said third current mirror circuit and which is connected between said first power source terminal and said second power source terminal, a fourth constant current source being connected in series with said second transistor between said first power source terminal and said second power source terminal, and first and second output transistors which are connected in series with each other between said first power source terminal and said second power source terminal and whose control electrodes are connected respectively to the connection point of said fourth constant current source and said second transistor and to the output terminal of said third current mirror circuit; and the connection point of said first and second output transistors is connected to an output terminal.

14. An operational amplifier according to claim 13, further comprising;

a fifth constant current source connected between the connection point of said first and second output transistors, and said first power source terminal.

15. An operational amplifier according to claim 14, further comprising;

a sixth constant current source connected between the connection point of said first and second output transistors and said second power source terminal.

* * * * *